United States Patent
Yug et al.

(10) Patent No.: US 12,144,238 B2
(45) Date of Patent: *Nov. 12, 2024

(54) DISPLAY APPARATUS AND METHOD OF MANUFACTURING THE SAME

(71) Applicant: SAMSUNG DISPLAY CO., LTD., Yongin-si (KR)

(72) Inventors: Geunwoo Yug, Yongin-si (KR); Myeongseok Jeong, Yongin-si (KR); Soobum Park, Yongin-si (KR); Junghwa You, Yongin-si (KR); Ilyoung Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/191,135

(22) Filed: Mar. 28, 2023

(65) Prior Publication Data

US 2023/0232696 A1    Jul. 20, 2023

Related U.S. Application Data

(60) Continuation of application No. 17/073,726, filed on Oct. 19, 2020, now Pat. No. 11,637,270, which is a
(Continued)

(30) Foreign Application Priority Data

Feb. 20, 2018 (KR) ........................ 10-2018-0020010

(51) Int. Cl.
*H10K 71/00*     (2023.01)
*H10K 50/86*     (2023.01)
(Continued)

(52) U.S. Cl.
CPC ............. *H10K 71/00* (2023.02); *H10K 50/86* (2023.02); *H10K 59/12* (2023.02); *H10K 59/40* (2023.02);
(Continued)

(58) Field of Classification Search
CPC ................................ H10K 71/80; H01L 21/78
See application file for complete search history.

(56) References Cited

U.S. PATENT DOCUMENTS 8,841,150 B2   9/2014  Kim et al.
9,577,015 B2 * 2/2017  Suzuki ................ H10K 59/123
(Continued)

FOREIGN PATENT DOCUMENTS

JP     2009-122386     6/2009
KR   10-2006-0069881   6/2006
(Continued)

*Primary Examiner* — Sue A Purvis
*Assistant Examiner* — Victor V Barzykin
(74) *Attorney, Agent, or Firm* — CHAU & ASSOCIATES, LLC

(57) ABSTRACT

A method of manufacturing a display apparatus includes separating a mother substrate that includes a plurality of connected unit display apparatuses into a plurality of separated unit display apparatuses. Each separated unit display apparatus includes a display panel and at least one supporting unit attached below the display panel. The display panel includes a display substrate that has a pad area on which are disposed a plurality of pads and a thin film encapsulation layer on the display substrate. The method further includes consecutively cutting the display panel and the at least one supporting unit of each separated unit display apparatus along cutting lines in the pad area, where a first cut surface of the pad area of the display substrate and a second cut surface of the at least one supporting unit are respectively cut at different angles.

13 Claims, 9 Drawing Sheets

Related U.S. Application Data division of application No. 16/164,243, filed on Oct. 18, 2018, now Pat. No. 10,811,640.

(51) Int. Cl.
  *H10K 59/12* (2023.01)
  *H10K 59/40* (2023.01)
  *H10K 71/80* (2023.01)
  *H10K 77/10* (2023.01)
  *H10K 102/00* (2023.01)

(52) U.S. Cl.
  CPC ........... *H10K 71/80* (2023.02); *H10K 77/111* (2023.02); *H10K 59/1201* (2023.02); *H10K 71/851* (2023.02); *H10K 2102/311* (2023.02)

(56) References Cited

U.S. PATENT DOCUMENTS

| | | | |
|---|---|---|---|
| 9,677,016 B2 | 2/2017 | Suzuki et al. | |
| 9,870,023 B2 | 1/2018 | Namkung et al. | |
| 10,326,113 B2* | 6/2019 | Yug | B23K 26/0624 |
| 10,328,113 B2 | 6/2019 | Yug | |
| 10,340,464 B2 | 7/2019 | Yug | |
| 10,608,192 B2 | 3/2020 | Yug | |
| 10,811,640 B2 | 10/2020 | Yug et al. | |
| 11,342,521 B2* | 5/2022 | Fujiwara | H10K 71/00 |
| 11,637,270 B2* | 4/2023 | Yug | H10K 59/40 257/40 |
| 2004/0245683 A1* | 12/2004 | Kuhlmann | B22D 1/005 266/225 |
| 2007/0214925 A1 | 9/2007 | Nishio et al. | |
| 2011/0062479 A1* | 3/2011 | Sugano | H01L 24/32 257/98 |
| 2011/0194063 A1* | 8/2011 | Lee | G02F 1/1339 313/504 |
| 2013/0011969 A1 | 1/2013 | Chen et al. | |
| 2013/0302539 A1 | 11/2013 | Fuji et al. | |
| 2014/0353625 A1 | 12/2014 | Yi et al. | |
| 2015/0214502 A1 | 7/2015 | Sato | |
| 2015/0264805 A1 | 9/2015 | Chen et al. | |
| 2015/0323829 A1* | 11/2015 | Huh | G02F 1/133514 445/25 |
| 2015/0323830 A1* | 11/2015 | Peng | B32B 3/02 438/460 |
| 2016/0111480 A1* | 4/2016 | Suzuki | H10K 71/80 257/93 |
| 2016/0315293 A1* | 10/2016 | You | B23K 26/40 |
| 2016/0343984 A1* | 11/2016 | Zeng | H10K 50/844 |
| 2017/0040569 A1* | 2/2017 | Watabe | H10K 50/805 |
| 2017/0092863 A1* | 3/2017 | Bower | H10K 71/00 |
| 2017/0358781 A1* | 12/2017 | Kang | G02F 1/133351 |
| 2017/0359899 A1* | 12/2017 | Heo | H05K 1/117 |
| 2017/0369899 A1 | 12/2017 | Heo et al. | |
| 2018/0102480 A1* | 4/2018 | Yug | H01L 27/1214 |
| 2018/0161845 A1 | 5/2018 | Jeong et al. | |
| 2018/0159087 A1 | 6/2018 | Yug | |
| 2019/0259977 A1 | 8/2019 | Yug et al. | |
| 2019/0273208 A1* | 9/2019 | Yug | H01L 27/1218 |
| 2020/0287168 A1 | 9/2020 | Kang et al. | |
| 2020/0335718 A1* | 10/2020 | Xie | H10K 77/111 |
| 2021/0036267 A1 | 2/2021 | Yug et al. | |

FOREIGN PATENT DOCUMENTS

| | | |
|---|---|---|
| KR | 10-2012-0016467 | 2/2012 |
| KR | 10-2013-0027258 | 3/2013 |
| KR | 10-2014-0038135 | 3/2014 |
| KR | 10-2014-0045837 | 4/2014 |
| KR | 10-2014-0065547 | 5/2014 |
| KR | 10-2015-0045076 | 4/2015 |
| KR | 10-2016-0072371 | 6/2016 |
| KR | 10-2017-0080225 | 7/2017 |
| KR | 10-2018-0039223 | 4/2018 |

* cited by examiner

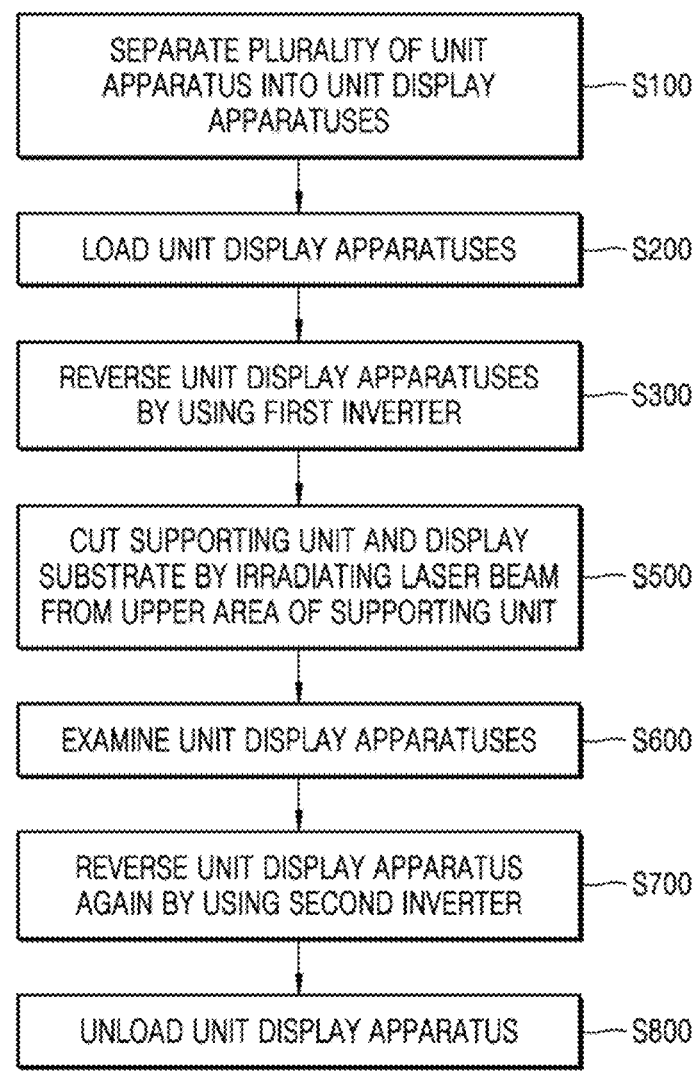

DISPLAY APPARATUS AND METHOD OF MANUFACTURING THE SAME

CROSS-REFERENCE TO RELATED APPLICATION

This application is a continuation of U.S. application Ser. No. 17/073,726, filed on Oct. 19, 2020 in the U.S. Patent and Trademark Office, which is a divisional of U.S. application Ser. No. 16/164,243, filed on Oct. 18, 2018 in the U.S. Patent and Trademark Office, which claims priority under 35 U.S.C. § 119 from, and the benefit of, Korean Patent Application No. 10-2018-0020010, filed on Feb. 20, 2018 in the Korean Intellectual Property Office, the contents of all of which are herein incorporated by reference in their entireties.

BACKGROUND

1. Technical Field

One or more embodiments relate to a display apparatus and a method of manufacturing the display apparatus.

2. Discussion of Related Art

In general, display apparatuses can be used in mobile devices, such as smartphones, laptop computers, digital cameras, camcorders, or personal digital assistants (PDA), and electronic devices, such as desktop computers, televisions, outdoor advertisement boards, or sample display devices.

Recently, thin display apparatuses have been released into the market.

Flexible display apparatuses are easy to carry and can be incorporated into various types of devices. Among the various types of display apparatuses, flexible display apparatuses based on an organic light-emitting display technology are the most popular.

For convenience in manufacturing, a plurality of unit display apparatuses are formed on a mother substrate and then are separated into unit display apparatuses. However, in a cutting process, due to heat generated in the unit display apparatuses, metal wirings may carbonize.

SUMMARY

One or more embodiments include a display apparatus in which a plurality of unit display apparatuses can be separated into unit display apparatuses and a method of manufacturing the display apparatus.

Additional embodiments will be set forth in part in the description which follows and, in part, will be apparent from the description, or may be learned by practice of the presented embodiments.

According to one or more embodiments, a method of manufacturing a display apparatus includes separating a mother substrate that includes a plurality of connected unit display apparatuses into a plurality of separated unit display apparatuses, where each separated unit display apparatus includes a display panel and at least one supporting unit attached below the display panel, the display panel includes a display substrate having a pad area on which are disposed a plurality of pads; and consecutively cutting the display panel and the at least one supporting unit of each separated unit display apparatus along cutting lines in the pad area of the display panel, wherein a first cut surface of the pad area of the display substrate and a second cut surface of the at least one supporting unit are respectively cut at different angles.

Consecutively cutting the display substrate and the at least one supporting unit includes: inverting each separated unit display apparatus using a first inverter such that the at least one supporting unit is positioned above the display panel; consecutively cutting the at least one supporting unit and the display substrate by irradiating a laser beam from an upper area of the at least one supporting unit; and inverting again each unit display apparatus using a second inverter such that the display panel is positioned above the at least one supporting unit.

Consecutively cutting the at least one supporting unit and the display substrate may include irradiating the laser beam in a vertical direction from an upper area of the at least one supporting unit toward an area where the at least one supporting unit and the pad area of the display substrate overlap each other.

Consecutively cutting the at least one supporting unit and the display substrate may include moving the laser beam in a direction crossing an extension direction of the plurality of pads to an edge of the display substrate and consecutively cutting the at least one supporting unit and the display substrate across the plurality of pads.

A first angle is formed between the first cut surface and a vertical axis perpendicular to a plane of a bottom surface of the at least one supporting unit, and a second angle is formed between the vertical axis and a second cut surface, wherein the second angle may be greater than the first angle.

The first angle may be less than or equal to 10°.

According to one or more embodiments, a method of manufacturing a display apparatus includes: separating a mother substrate that includes a plurality of connected unit display apparatuses into a plurality of separated unit display apparatuses, wherein each separated unit display apparatus includes a display panel and at least one supporting unit attached below the display panel, the display panel includes a display substrate having a pad area on which are disposed a plurality of pads; performing a first laser beam machining operation with a first laser beam that cuts the supporting unit of each of the plurality of separated unit display apparatuses; and performing a second laser beam machining operation with a second laser beam that cuts the pad area of the display substrate of each of the plurality of separated unit display apparatuses.

The first laser beam machining operation may include a one-time process that cuts the at least one supporting unit of each of the plurality of separated unit display apparatuses.

The first laser beam may have a magnitude sufficient to cut from a surface of the at least one supporting unit to a boundary between the at least one supporting unit and the pad area of the display substrate of each of the plurality of separated unit display apparatuses The second laser beam machining operation may cut the pad area of the display substrate in from about 90 to about 100 repetitions.

The second laser beam may have an output less than or equal to 5 W and may be moved in a direction crossing an extension direction of the plurality of pads to an edge of the display substrate at a rate equal to or greater than 1.0 m/s.

Consecutively cutting the display panel and the at least one supporting unit of each separated unit display apparatus along cutting lines in the pad area of the display panel may include cutting the plurality of connected unit display apparatuses along dummy cutting lines in a dummy pad area that extends from a pad area of each of the plurality of unit display apparatuses that includes dummy pads respectively connected to the pads.

The at least one supporting unit may include a protection film attached below the display substrate by a first adhesive, and a carrier film attached below the protection film by a second adhesive, where the carrier may be removed from the protection film after the cutting.

A thin film encapsulation layer may be disposed on the display substrate, and a polarizing layer may be formed above the thin film encapsulation layer.

According to one or more embodiments, a display apparatus includes a display panel that includes a display substrate having a pad area on which a plurality of pads are disposed, and a thin film encapsulation layer on the display substrate; and at least one supporting unit arranged below the display panel, wherein a first cut surface formed by cutting the plurality of pads and the display substrate extends from an edge of the pad area of the display substrate, a second cut surface formed by cutting the at least one supporting unit extends from an edge of the at least one supporting unit where first cut surface meets the at least one supporting unit, and the first cut surface and the second cut surface are cut at different angles.

A first angle is formed between the first cut surface and a vertical axis perpendicular to a plane of a bottom surface of the at least one supporting unit, and a second angle is formed between the vertical axis and a second cut surface, wherein the second angle may be greater than the first angle.

The first angle may be less than or equal to 10°.

The at least one supporting unit may include a protection film attached below the display panel.

The display panel may include a polarizing layer disposed above the thin film encapsulation layer.

The display panel may include: at least one thin film transistor that includes a semiconductor activation layer, a gate electrode, a source electrode, and a drain electrode disposed on the display substrate; and an organic light-emitting device electrically connected to the thin film transistor that includes a first electrode, a second electrode, and an emission layer.

BRIEF DESCRIPTION OF THE DRAWINGS

FIG. 6 is a flowchart of a process of manufacturing a unit display apparatus, according to an embodiment.

DETAILED DESCRIPTION

Figure 1:
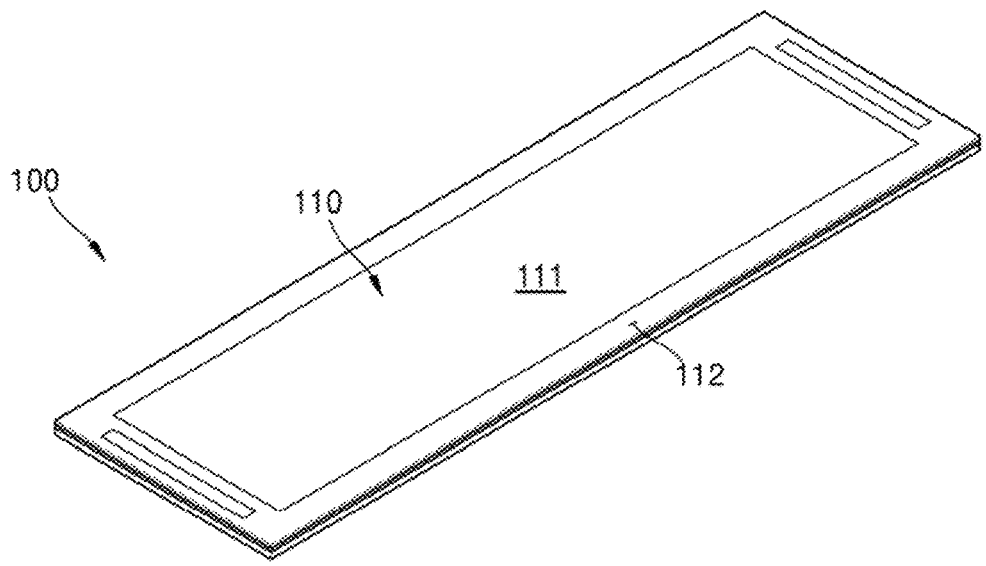
FIG. 1 is a perspective view of a display apparatus in an unbent state, according to an embodiment.

As the present disclosure allows for various changes and numerous embodiments, exemplary embodiments will be illustrated in the drawings and described in detail in the written description. Features of the present disclosure and methods of achieving the features will be described more fully with reference to the accompanying drawings, in which exemplary embodiments of the present disclosure are shown. The present disclosure may, however, be embodied in many different forms and should not be construed as limited to the exemplary embodiments set forth herein.

It will be understood that when a layer, film, region, or component is referred to as being "formed on," another layer, film, region, or component, it may be directly or indirectly formed on the other layer, film, region, or component. Also, sizes of elements in the drawings may be exaggerated for convenience of explanation.

Reference will now be made in detail to embodiments, examples of which are illustrated in the accompanying drawings, wherein like reference numerals may refer to like elements throughout, and repeated descriptions will not be given.

Figure 2:
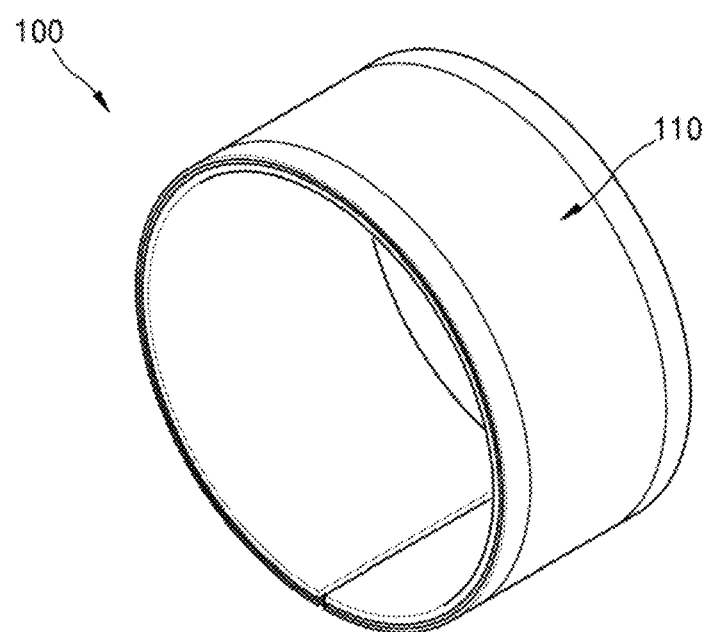
FIG. 2 is a perspective view of a display apparatus of FIG. 1 in a rolled state, according to an embodiment.

FIG. 1 is a perspective view of a display apparatus in an unbent state according to an embodiment, and FIG. 2 is a perspective view of a display apparatus of FIG. 1 in a rolled state.

Referring to FIGS. 1 and 2, according to an embodiment, a display apparatus 100 includes a display panel 110. The display panel 110 is a flexible film. The display panel 110 includes a display area 111 that displays images and a non-display area 112 that extends in an outer area of the display area 111.

In an embodiment, the display apparatus 100 further includes various function layers, such as a supporting unit, a touch sensing unit, and a polarizing layer, etc. When the display apparatus 100 is in operation, images can be seen in the various states of the display apparatus 100, such as a flat state, a curved state, or a cylindrical rolled state. The display apparatus 100 corresponds to a unit display apparatus.

Figure 3:
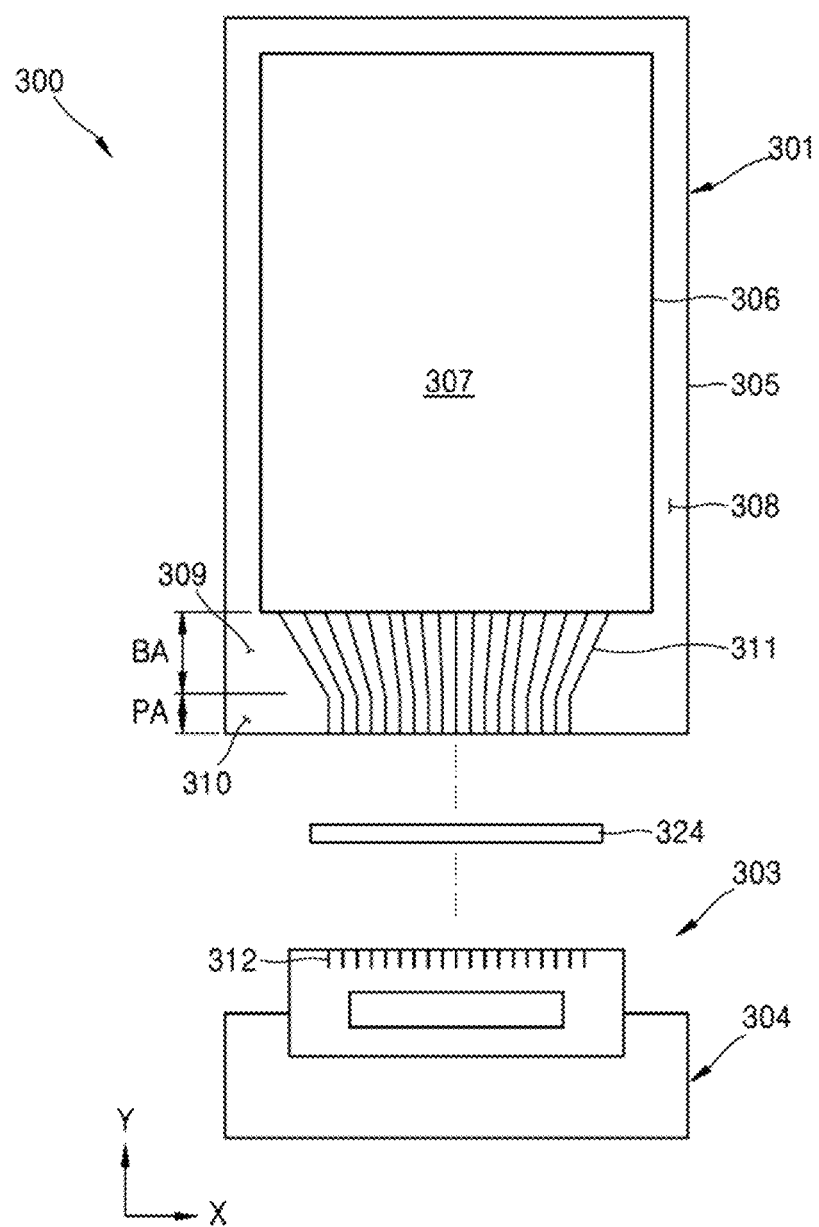
FIG. 3 is a top-plan view of a unit display apparatus according to an embodiment.
Figure 4:
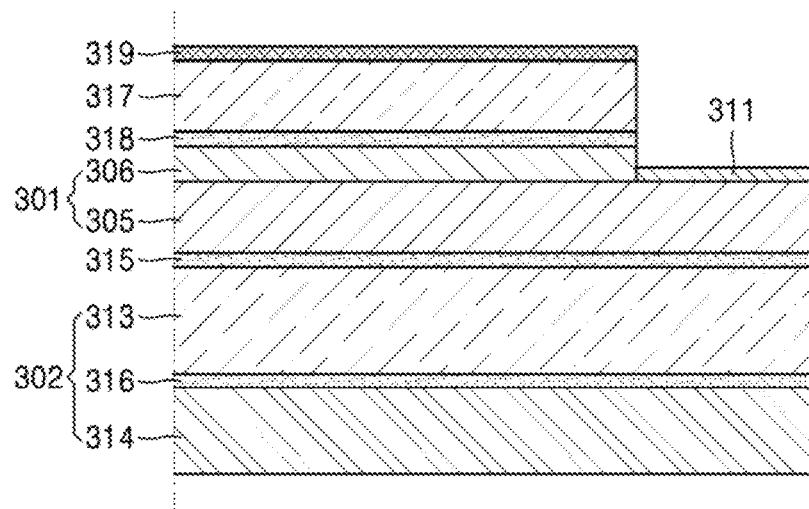
FIG. 4 is a partial cross-sectional view of a unit display apparatus of FIG. 3.

FIG. 3 is a top-plan view of a unit display apparatus according to an embodiment, and FIG. 4 is a partial cross-sectional view of a unit display apparatus of FIG. 3.

Referring to FIGS. 3 and 4, according to an embodiment, a unit display apparatus 300 is a flexible display apparatus.

According to an embodiment, the unit display apparatus 300 includes a display panel 301. The display panel 301 includes a display substrate 305 that includes a plurality of elements and a thin film encapsulation layer 306 disposed on the display substrate 305. The elements disposed on the display substrate 305 include a plurality of thin film transistors TFT and a plurality of light-emitting devices connected to the thin film transistors.

According to an embodiment, the display substrate 305 includes a display area 307 that displays images and a non-display area 308 that extends in an outer area of the display area 307. Thin film transistors and light-emitting devices are disposed in the display area 307. The thin film encapsulation layer 306 covers the thin film transistors and the light-emitting devices. The non-display area 308 include a bending area (BA) 309, used to bend the display panel 301 in one direction, and a pad area (PA) 301 that extends in an outer area of the bending area 309.

According to an embodiment, the pad area 310 is disposed at an edge of the display substrate 305. A plurality of pads 311 are disposed in the pad area 310. The pads 311 are electrically connected to the light-emitting devices arranged in the display area 307.

According to an embodiment, a driving unit 303 is connected to the display panel 301. The plurality of pads 311 are electrically connected to a plurality of driving terminals 312 in the driving unit 303. Conductive units 324 that electrically connect each of the pad terminals in the pads 311 to each of the driving terminals 312 in the driving unit 303 are provided between the plurality of pads 311 and the plurality of driving terminals 312.

According to an embodiment, the driving unit 303 is electrically connected to a circuit board 304. The circuit board 304 is a flexible printed circuit board (FPCB).

According to an embodiment, a supporting unit 302 is disposed below the display substrate 305. The supporting unit 302 includes a protection film 313 attached below the display substrate 305 by a first adhesive 315, and a carrier film 314 attached below the protection film 313 by a second adhesive 316.

According to an embodiment, protection film 313 and the carrier film 314 are polymer films. In an embodiment, the protection film 313 and the carrier film 314 include polyethyleneterephthalate (PET).

According to an embodiment, the protection film 313 protects the display substrate 305 from foreign substances and increases the rigidity of the display substrate 305. A thickness of the protection film 313 is greater than that of the display substrate 305. The protection film 313 is bendable. The protection film 313 is firmly attached below the display substrate 305 via the first adhesive 315.

According to an embodiment, the carrier film 314 is an insulating film that is used while manufacturing the unit display apparatus 300. In an embodiment, when manufacturing a plurality of unit display apparatuses using a mother substrate, the carrier film 314 covers each of the unit display apparatuses 300. The carrier film 314 protects the unit display apparatuses 300 in manufacturing or transportation processes. The carrier film 314 is removed from finished products.

According to an embodiment, a thickness of the carrier film 314 is less than the thickness of the protection film 313. The carrier film 314 is attached below the protection film 313 by the second adhesive 316, which is less sticky than the first adhesive 315, and after the plurality of unit display apparatuses are separated into unit display apparatuses, the carrier film 314 is removed.

According to an embodiment, at least one function layer 317 is disposed on the thin film encapsulation layer 306. The function layer 317 includes various layers, such as a polarizing layer, a touching sensing unit, etc. The function layer 317 is disposed above the thin film encapsulation layer 306 via a third adhesive 318. In another embodiment, the function layer 317 is directly patterned on an upper surface of the thin film encapsulation layer 306 without using the third adhesive 318. A cover film 319 is attached onto an upper area of the function layer 317. The cover film 319 protects the function layer 317 and is removed in a final manufacturing process.

According to an embodiment, when manufacturing the unit display apparatus 300, a cutting process is performed that separates a plurality of unit display apparatuses into respective display apparatuses 300. An edge of the display substrate 305 and an edge of the supporting unit 302 have cut surfaces that are respectively cut at different angles. An edge of the display substrate 305 is an area in which the pads 311 are arranged.

Figure 5:
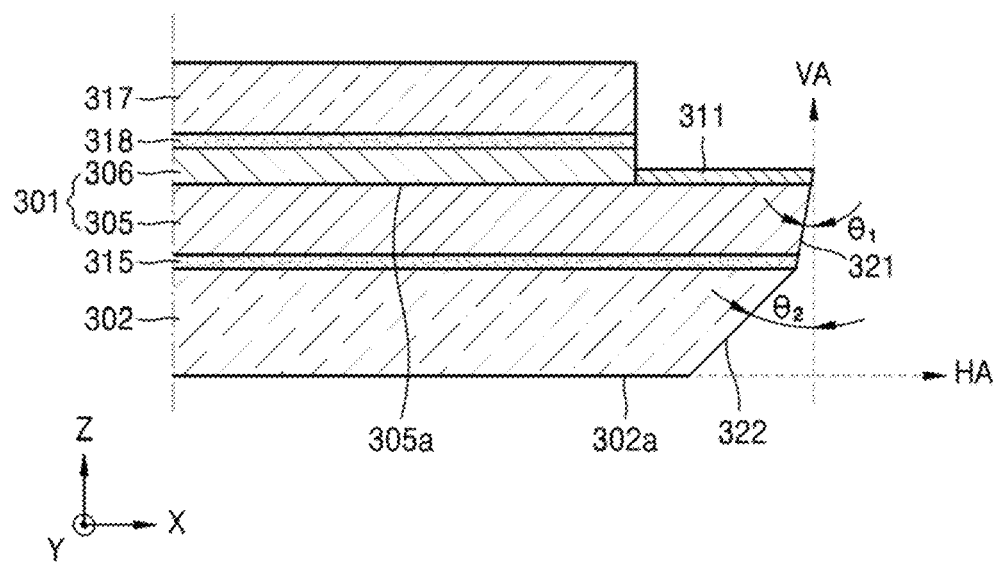
FIG. 5 is a partial cross-sectional view of a unit display apparatus of FIG. 3.

Referring to FIG. 5, according to an embodiment, a supporting unit 302 is disposed below the display panel 301, and the function layer 317 is disposed above the display panel 301. The supporting unit 302 includes the protection film 313 (see FIG. 4). In another embodiment, the supporting unit 302 includes the protection film 313 (see FIG. 4) and the carrier film 314 (see FIG. 4), and in this case, the carrier film 314 is removed after the cutting process.

According to an embodiment, the pads 311 extend along an edge in the pad area PA of the display substrate 305. At the edge of the display substrate 305, a first cut surface 321 is formed by cutting the display substrate 305 and the pads 311. The first cut surface 321 includes a cut surface of the display substrate 305 and a cut surface of the pads 311.

According to an embodiment, at an edge of the supporting unit 302 that corresponds to the edge of the display substrate 305, a second cut surface 322 is formed by cutting the supporting unit 320.

According to an embodiment, the first cut surface 321 and the second cut surface 322 are respectively cut at different angles.

According to an embodiment, let the display panel 301 and the supporting unit extend in a horizontal plane defined by an X axis and a Y axis, and let a vertical axis VA correspond to a Z axis that is normal to the X-Y plane. A horizontal axis HA corresponds to the X direction shown in FIG. 5. In detail, an angle with respect to the vertical axis VA between the first cut surface 321 and a bottom surface 302a of the supporting unit 302, is a first angle $\theta_1$. The bottom surface 302a of the supporting unit 302 is disposed opposite from the display substrate 305. The bottom surface 302a of the supporting unit 302 shown in FIG. 5 is a horizontal surface parallel to an XY plane. The supporting unit 302 and the display substrate 305 overlap each other in FIG. 5, and the bottom surface 302a of the supporting unit 302 is parallel to a horizontal surface 305a of the display substrate 305, and both surfaces are parallel to a horizontal axis HA.

According to an embodiment, the first angle $\theta_1$ between the vertical axis VA and the first cut surface 321 is less than or equal to 10°. The first cut surface 321 may be perpendicular to the bottom surface 302a of the supporting unit 302.

According to an embodiment, an angle between the vertical axis VA and the second cut surface 322 of the supporting unit 302 that extends up from the bottom surface 302a is a second angle $\theta_2$. The second angle $\theta_2$ is greater than the first angle $\theta_1$.

According to an embodiment, the second angle 62 is greater than the first angle 61 for, in a cutting process, an energy density of a laser beam irradiated onto the supporting unit 302 is relatively high, and an energy density of a laser beam irradiated onto the display substrate 305, where the pads 311 are disposed, is relatively low.

A process of manufacturing the unit display apparatus 300 according to an embodiment is described below, with reference to FIGS. 6, 7A through 7D.

Figure 7A:
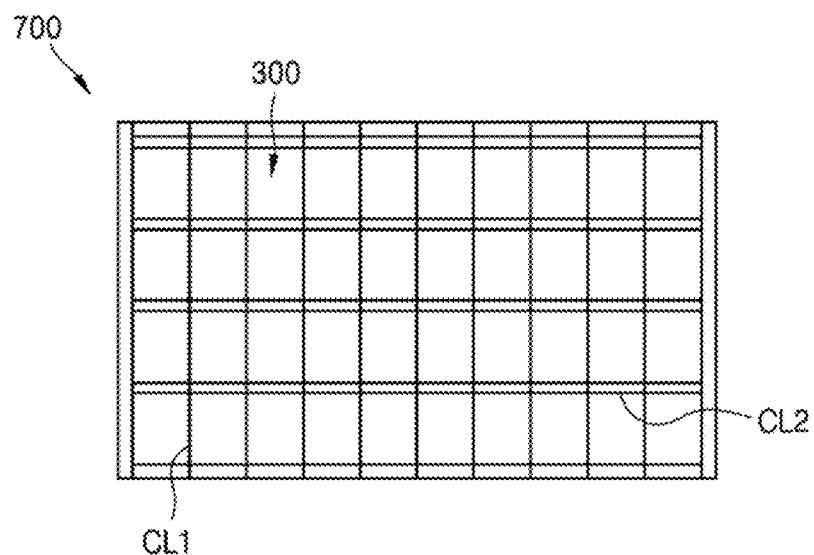
FIG. 7A illustrates cutting a plurality of connected unit display apparatuses on a mother substrate, according to an embodiment.

Referring to FIG. 7A, according to an embodiment, a plurality of connected unit display apparatuses disposed on a mother substrate 700 are separated into a plurality of separated respective unit display apparatuses 300 (S100). First, the mother substrate 700 is provided. The mother substrate 700 is used to simultaneously manufacture a plurality of unit display apparatuses 300. The mother substrate 700 is a glass substrate. A plurality of connected unit display apparatuses are formed on the mother substrate 700.

According to an embodiment, each unit display apparatus 300 includes the display panel 301 of FIG. 4 and the supporting unit 302 attached to the lower surface of the display panel 301. In detail, the protection film 313 and the carrier film 314 included in the supporting unit 302 have sizes that are identical to a size of the mother substrate 700. In an embodiment, the carrier film 314 is manufactured as a part of the unit display apparatus 300 is removed from a finished product.

Figure 7B:
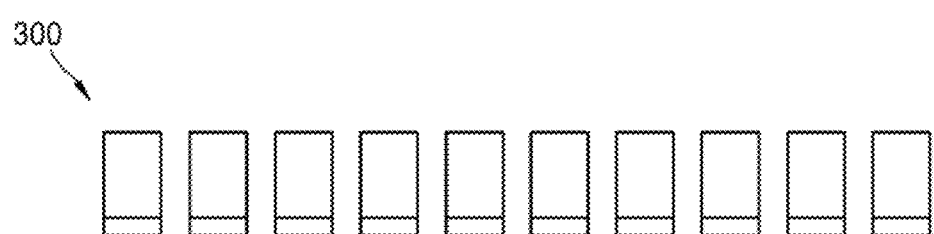
FIG. 7B is a top-plan view of connected unit display apparatuses of FIG. 7A separated into a plurality of separated unit display apparatuses.

According to an embodiment, a laser beam is irradiated onto the mother substrate 700 by a laser beam machining process, and the plurality of connected unit display apparatuses disposed on the mother substrate 700 are separated into the plurality of separated respective unit display apparatuses 300, as shown in FIG. 7B. The plurality of connected unit display apparatuses are cut along a first cutting line CL1 that corresponds to a first edge of each unit display apparatus 300 and a second cutting line CL2 that corresponds to a second edge of each unit display apparatus 300. A laser beam is irradiated onto the mother substrate 700 by a CO2 laser unit.

Figure 7C:
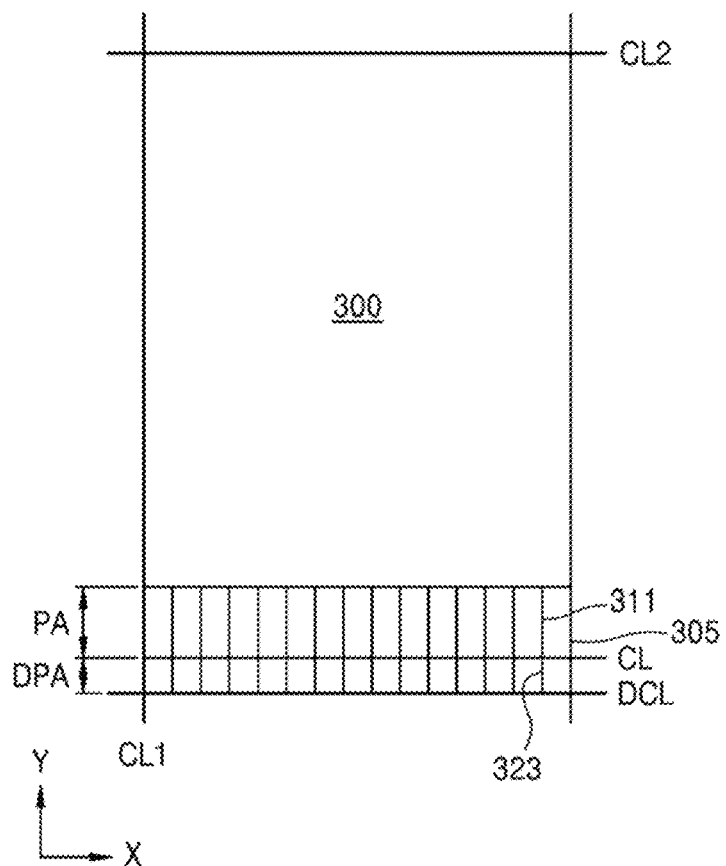
FIG. 7C is a top-plan view of cutting lines of separated unit display apparatuses of FIG. 7B.

Referring to FIG. 7C, according to an embodiment, each unit display apparatus 300 includes a dummy pad area DPA that extends from a pad area PA in which the pads 311 are disposed to an edge of the unit display apparatus 300 and that is cut off. Dummy pads 323 are disposed in the dummy pad area DPA adjacent to the pads 311. The dummy pad area DPA is used to manufacture the pad area PA and is removed in the cutting process.

In an embodiment, when performing a laser beam machining process on the mother substrate 700, when a laser beam is directly irradiated onto the pad area PA in which the pads 311 are disposed, the pads 311 may be carbonized. To prevent carbonization of the pads 311, each of the unit display apparatuses 300 is cut along a dummy cutting line DCL that corresponds to an edge of the dummy pad area DPA. Next, the connected unit display apparatuses 300 are cut along a cutting line CL that corresponds to an edge of the pad area PA of each of the unit display apparatuses 300.

According to an embodiment, to consecutively cut the display substrate 305 and the supporting unit 302, the unit display apparatus 300 is loaded onto a pad cutting apparatus (S200). Before loading the unit display apparatus 300, a function layer 317 is attached to the display panel 301.

Next, according to an embodiment, during the cutting process, to prevent carbonization in the pad area PA caused by the laser beam machining, the unit display apparatus 300 is reversed by a first inverter (S300). The first inverter is an apparatus that inverts a loaded unit display apparatus, such as a robot.

Figure 7D:
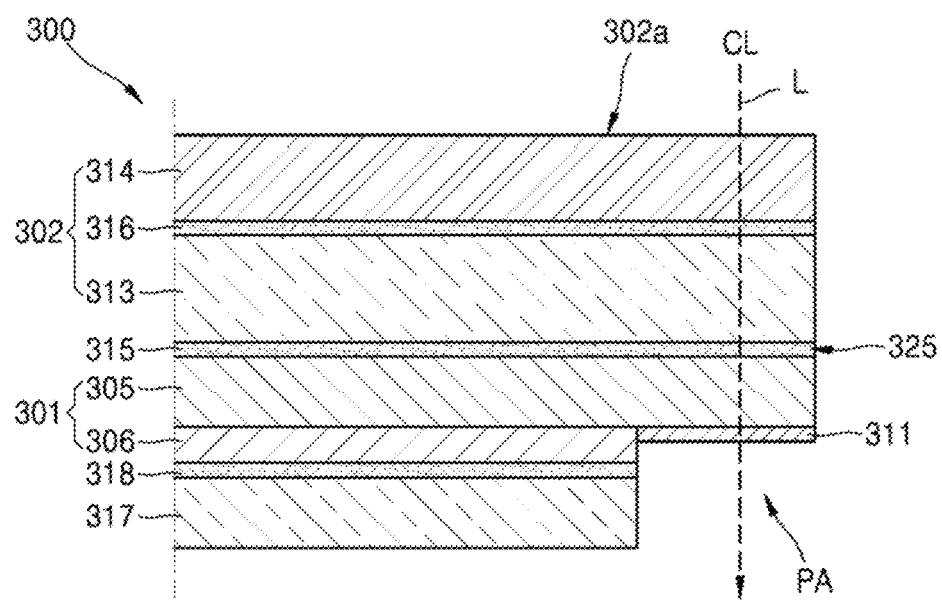
FIG. 7D illustrates irradiation of a laser beam onto a unit display apparatus of FIG. 7C.

According to an embodiment, when the unit display apparatus 300 is inverted, as illustrated in FIG. 7D, the supporting unit 302 is positioned above the display panel 301.

Next, a laser beam L is vertically irradiated into an upper area of the supporting unit 302, and cuts the display substrate 305 where the support unit 302 and the pad area PA are disposed (S500). The laser beam L is a short wavelength laser apparatus, such as a pico-second laser or a femto-second laser. Examples of short wavelength laser apparatuses include an ultraviolet (UV) pico-second laser apparatus, a green pico-second laser, an infrared ray (IR) pico-second laser, etc. As the supporting unit 302 includes a polymer film, such as polyethyleneterephthalate (PET), the supporting unit 302 is not carbonized when irradiated by the laser beam L According to an embodiment, the laser beam L irradiated along the cutting line CL that corresponds to an edge of the pad area PA consecutively cuts from the supporting unit 302 down to the display substrate 305 where the pads 311 are disposed.

According to an embodiment, the laser beam L is irradiated in a vertical direction from the upper area of the supporting unit 302 down to the pad area PA of the display substrate 305 on which the pads 311 are disposed. As the laser beam L is irradiated through the unit display apparatus 300, the laser beam L is moved in an X-direction that crosses the Y direction, as illustrated in FIG. 7C, crossing the pads 311. The laser beam L moving in the X direction along the cutting line CL consecutively cuts the supporting unit 302 and the display substrate 305, as shown in FIG. 7D.

According to an embodiment, when the laser beam machining process is completed, as shown in FIG. 5, the first cut surface 321 of the display substrate 305 and the second cut surface 322 formed by cutting by the supporting unit 302 are respectively cut at different angles. The first cut surface 321 extends down from the top surface of the display substrate 305, where the pads 311 are disposed, to a top surface of the supporting unit 302, where the first cut surface 321 meets the second cut surface 322, and the second cut surface 322 extends down from the top surface of the supporting unit 302 to the bottom surface 302a of the supporting unit 302.

According to an embodiment, an angle with respect to the vertical axis VA between the bottom surface 302a of the supporting unit 302 and the first cut surface 321 is the first angle $\theta_1$, and an angle with respect to the vertical axis VA between the bottom surface 302a of the supporting unit 302, and the second cut surface 322 of the supporting unit 302 is the second angle $\theta_2$. The second angle $\theta_2$ is greater than the first angle $\theta_1$. The first angle $\theta_1$ is less than or equal to about 10°.

According to an embodiment, the first cut surface 321 and the second cut surface 322 are respectively be cut at different angles as the laser beams respectively irradiated into the supporting unit 302 and the display substrate 305 have different energy densities.

More particularly, according to an embodiment, a laser beam machining process includes a first laser beam machining process to cut the supporting unit 302 and a second laser beam machining process to cut the display substrate 305.

Referring again to FIG. 7D, according to an embodiment, the supporting unit 302 is cut by a one-time irradiation of a laser beam into the supporting unit 302. The laser beam irradiated into the supporting unit 302 in the one-time process has a magnitude great enough to cut from the surface 302a of the supporting unit 302 to a boundary 325 between the supporting unit 325 and the display substrate 305. An output of the laser beam may vary according to a thickness of the supporting unit 302. In an embodiment, the laser beam irradiated into the supporting unit 302 has an output that equals or exceeds 16 W. For example, the irradiated laser beam has an output of from about 16.4 W to about 16.8 W. A machining rate of the irradiated laser beam is about 0.22 m/s.

Next, according to an embodiment, by irradiating several laser beams into the display substrate 305, the display substrate 305 is cut. Approximately 90 to 100 laser beams are irradiated into the display substrate 305. For example, 95 laser beams are irradiated into the display substrate 305. The laser beam irradiated into the display substrate 305 has an output less than or equal to about 5 W and a machining rate greater than equal to about 1.0 m/s. For example, the laser beam irradiated into the display substrate 305 has an output of from about 3.0 W to about 3.3 W and a machining rate equal to or faster than 1.0 m/s.

As described above, according to an embodiment, by irradiating a relatively high energy density laser beam into the supporting unit 302 and irradiating a relatively low energy density laser beam into the display substrate 305, a cutting process of the unit display apparatus 300 is performed.

Accordingly, according to an embodiment, as described above, the supporting unit 302 to which the laser beam is preferentially irradiated comes to have a wider cut area, and the display substrate 305 comes to have a narrower cut area, and the second angle θ2 may be greater than the first angle θ1.

According to an embodiment, when the cutting process is finished, it is checked whether the first cut surface 321 and the second cut surface 322 are properly cut (S600).

Next, according to an embodiment, using a second inverter, the unit display apparatus 300 is inverted again (S700). When the unit display apparatus 300 is inverted again, the display panel 301 is positioned above the supporting unit 302.

Next, according to an embodiment, the unit display apparatus 300 after the cutting process is unloaded from the pad cutting device (S800), and additional processes may be performed.

Through the aforementioned processes according to embodiments, a unit display apparatus 300 is manufactured.

Figure 8:
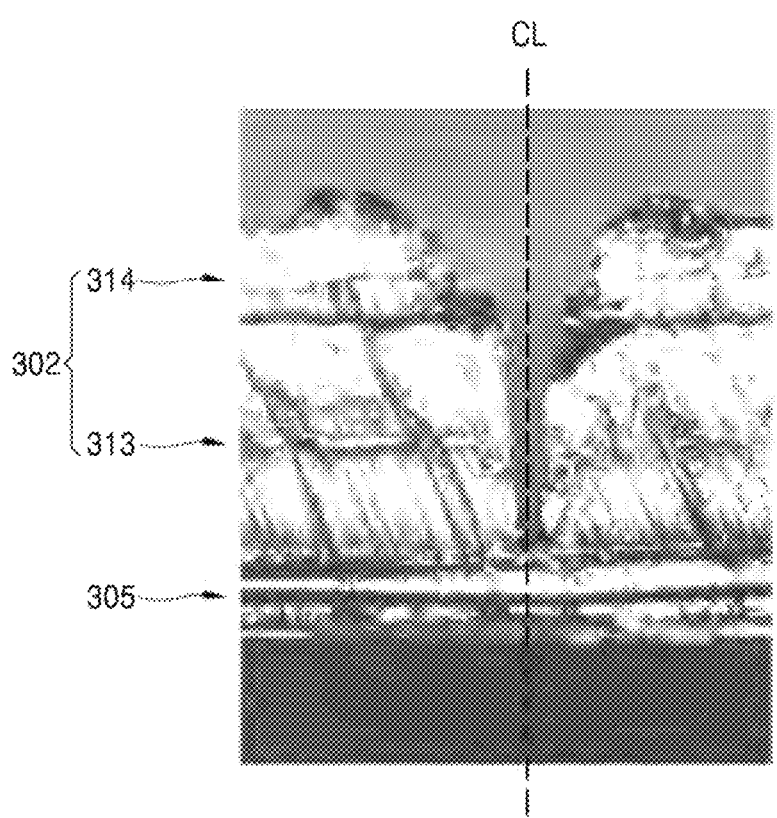
FIG. 8 is a picture of a cut surface of a unit display device, according to an experiment of the applicant.

FIG. 8 is a picture of cut surface of the unit display apparatus 300, according to an experiment performed by the inventor.

Referring to FIG. 8, according to an embodiment, an irradiated laser beam continually cuts from the supporting unit 302 to the display substrate 305 along a cutting line CL that corresponds to an edge of the pad area PA of the display substrate 305.

According to an embodiment, the display substrate 305, to which a low energy density laser beam is irradiated, is cut in a substantially vertical direction. On the other hand, the supporting unit 302, to which a high energy density laser beam is irradiated, is cut in a slope at a greater angle than a cut angle of the display substrate 305.

Figure 9:
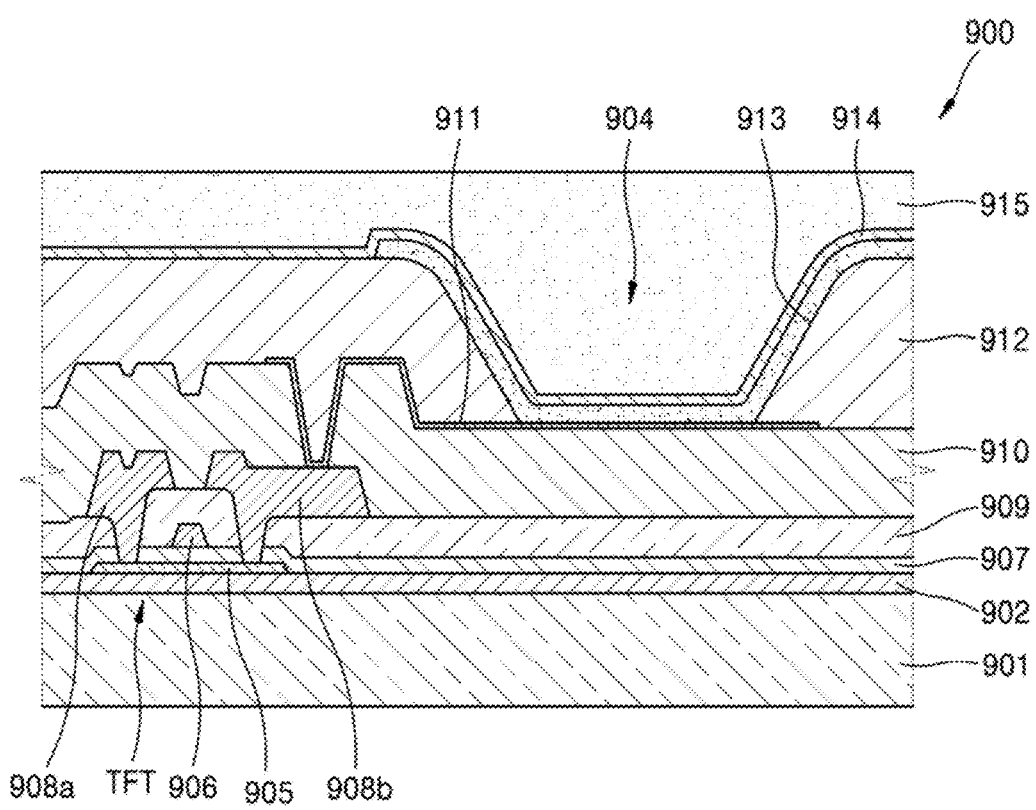
FIG. 9 is a cross-sectional view of a sub pixel included in a display device according to an embodiment.

FIG. 9 is a cross-sectional view of a sub pixel of an organic light-emitting display apparatus 900, according to an embodiment.

In an embodiment, the sub pixels have at least one thin film transistor TFT and at least one organic light-emitting device. However, a thin film transistor does not necessarily have a structure shown in FIG. 9, and the number and the structure of the thin film transistors may be variously changed or modified in other embodiments.

Referring to FIG. 9, according to an embodiment, the display apparatus 900 includes a display substrate 901. The display substrate 901 is a flexible substrate.

According to an embodiment, an insulating layer 902 is disposed on the display substrate 901.

According to an embodiment, a semiconductor layer 905 is disposed the insulating layer 902. The semiconductor layer 905 may be a p-type semiconductor or an n-type semiconductor. A gate insulating layer 907 is disposed on the semiconductor layer 905. The gate insulating layer 907 covers the semiconductor layer 905. The gate insulating layer 907 may be a single layer or a multilayer.

According to an embodiment, a gate electrode 906 is disposed on the gate insulating layer 907. The gate electrode 906 may include a single metal or a plurality of metals. An interlayer insulating layer 909 is disposed on the gate electrode 906. The interlayer insulating layer 909 covers the gate electrode 906. The interlayer insulating layer 909 may be an organic layer or an inorganic layer.

According to an embodiment, a source electrode 908a and a drain electrode 908b are disposed on the interlayer insulating layer 909. A part of the gate insulating layer 907 and a part of the interlayer insulating layer 909 are selectively removed to form contact holes that expose the semiconductor layer 905. The source electrode 908a and the drain electrode 908b are electrically connected to the semiconductor layer 905 that is exposed through the contact holes. A protection layer 910 is disposed on the source electrode 908a and the drain electrode 908b. The protection layer 910 may be a passivation layer or a planarization layer.

According to an embodiment, the aforementioned thin film transistor is electrically connected to a display element 904. In an embodiment, the display element 904 is an organic light-emitting device, however, the display element 904 is not limited thereto, and various other types of display elements may be provided in other embodiments.

According to an embodiment, the display element 904 is disposed on the protection layer 910. The display element 904 includes a first electrode 911, an intermediate layer 913, and a second electrode 914.

According to an embodiment, the first electrode 911 is connected through the contact holes to one of the source electrode 908a or the drain electrode 908b. A pixel defining layer 912 is disposed on the protection layer 910. The pixel defining layer 912 defines a light-emitting area of each sub pixel by surrounding edges of the first electrode 911.

According to an embodiment, the intermediate layer 913 is disposed on the first electrode 911 in an area exposed by etching a part of the pixel defining layer 912. The second electrode 914 is disposed on the intermediate layer 913. In an embodiment, a plurality of sub pixels are formed on the display substrate 901. For example, each sub pixel may be one of a red, green, blue, or white pixel.

According to an embodiment, the intermediate layer 913 includes emission layers (EML) for red, green, blue, and in addition to the EMLs, the intermediate layer 913 includes, for example, a hole injection layer (HIL), an electron transport layer (ETL), and an electron injection layer (EIL) sequentially stacked in a single or composite structure.

According to an embodiment, a sealing unit 915 covers the display element 904. The sealing unit 915 includes alternating inorganic layers and organic layers.

As described above, according to an embodiment, by using a display apparatus and a method of manufacturing a display apparatus, carbonization of a pad area can be prevented as a laser beam is irradiated through an upper area of the supporting unit.

Furthermore, according to an embodiment, a time for processing the unit display apparatuses may be reduced.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus, comprising:
a display panel that includes a substrate that includes a pad area in which a plurality of pads are disposed; and
a supporting unit attached below the display panel,
wherein a first cut surface is formed by cutting at least a portion of the pad area of the substrate,
a second cut surface is formed by cutting the supporting unit,
wherein a slope of the first cut surface differs from a slope of the second cut surface.

2. The display apparatus of claim 1, wherein
the first cut surface is cut in a direction that crosses a horizontal surface of the display panel,
the second cut surface is cut in a direction that crosses a bottom surface of the supporting unit, and
the horizontal surface of the display panel and the bottom surface of the supporting unit are parallel.

3. The display apparatus of claim 2, wherein
a first angle is formed between the first cut surface and a vertical axis perpendicular to a plane of the bottom surface of the supporting unit,
a second angle is formed between the vertical axis and the second cut surface,
wherein the second angle is greater than the first angle.

4. The display apparatus of claim 3, wherein
the first angle is less than or equal to 10°.

5. The display apparatus of claim 2, wherein
the first cut surface extends down from a top surface of the substrate, where the pad area is disposed, to a top surface of the supporting unit, where the first cut surface meets the second cut surface.

6. The display apparatus of claim 2, wherein
the second cut surface extends down from a top surface of the supporting unit to the bottom surface of the supporting unit.

7. The display apparatus of claim 2, wherein
the first cut surface is substantially perpendicular to a plane of the bottom surface of the supporting unit.

8. The display apparatus of claim 1, wherein
the first cut surface and the second cut surface are consecutively cut by irradiation of a plurality of laser beams.

9. The display apparatus of claim 8, wherein
the supporting unit is cut by a first laser beam, and
the substrate in which the pad area is disposed is cut by a second laser beam.

10. The display apparatus of claim 9, wherein
an energy density of the first laser beam is greater than an energy density of the second laser beam.

11. The display apparatus of claim 1, wherein
the supporting unit comprises a protection film attached to a surface of the substrate.

12. The display apparatus of claim 1, further comprising an encapsulation layer disposed above the substrate.

13. The display apparatus of claim 1, wherein the display panel comprises;
at least one thin film transistor that includes a semiconductor active layer, a gate electrode, a source electrode, and a drain electrode disposed on the substrate; and
an organic light-emitting device electrically connected to the thin film transistor and that includes a first electrode, a second electrode, and an emission layer.

* * * * *